(12) United States Patent
Kuo et al.

(10) Patent No.: US 11,415,762 B2
(45) Date of Patent: Aug. 16, 2022

(54) OPTICAL BENCH, METHOD OF MAKING AND METHOD OF USING

(71) Applicant: TAIWAN SEMICONDUCTOR MANUFACTURING COMPANY, LTD., Hsinchu (TW)

(72) Inventors: Ying-Hao Kuo, Hsinchu (TW); Shang-Yun Hou, Hsinchu (TW); Wan-Yu Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 70 days.

(21) Appl. No.: 17/116,806

(22) Filed: Dec. 9, 2020

(65) Prior Publication Data

US 2021/0088737 A1    Mar. 25, 2021

Related U.S. Application Data

(63) Continuation of application No. 15/483,310, filed on Apr. 10, 2017, now Pat. No. 10,866,374, which is a
(Continued)

(51) Int. Cl.
*G02B 6/42* (2006.01)
*H01S 5/0237* (2021.01)
(Continued)

(52) U.S. Cl.
CPC .......... *G02B 6/4259* (2013.01); *G02B 6/12* (2013.01); *G02B 6/122* (2013.01); *G02B 6/4214* (2013.01);
(Continued)

(58) Field of Classification Search
CPC .......... G02B 6/12; G02B 6/43; G02B 6/4214; G02B 6/42
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |

(Continued)

FOREIGN PATENT DOCUMENTS

| | | |
|---|---|---|
| CN | 1910486 | 2/2007 |
| TW | 201131229 | 9/2011 |
| TW | 20114231 | 12/2011 |

OTHER PUBLICATIONS

Office Action dated Mar. 5, 2014 from corresponding application No. TW 101122935.

*Primary Examiner* — Thomas A Hollweg
*Assistant Examiner* — Mary A El-Shammaa
(74) *Attorney, Agent, or Firm* — Hauptman Ham, LLP (57) ABSTRACT

A method of forming an optical bench includes forming a reflector layer over a sloping side of a substrate. The method includes depositing a redistribution layer over the substrate. The method includes disposing an under bump metallization (UBM) layer over the redistribution layer. The method includes forming a passivation layer over the redistribution layer and surrounding sidewalls of the UBM layer. The method includes mounting a first optical component over an uppermost portion of the substrate, wherein the reflector layer is configured to reflect an electromagnetic wave from the first optical component, and the first optical component is mounted outside the trench.

20 Claims, 7 Drawing Sheets

Related U.S. Application Data continuation of application No. 14/699,151, filed on Apr. 29, 2015, now Pat. No. 9,618,712, which is a continuation-in-part of application No. 13/403,566, filed on Feb. 23, 2012, now Pat. No. 10,180,547.

(51) Int. Cl.

| | | |
|---|---|---|
| *H01S 5/02326* | (2021.01) | |
| *G02B 6/12* | (2006.01) | |
| *G02B 6/122* | (2006.01) | |
| *H01L 25/16* | (2006.01) | |
| *H01S 5/00* | (2006.01) | |
| *G02B 6/136* | (2006.01) | |
| *H01S 5/183* | (2006.01) | |
| *H01S 5/30* | (2006.01) | |

(52) U.S. Cl.
CPC .......... *G02B 6/4246* (2013.01); *H01S 5/0237* (2021.01); *H01S 5/02326* (2021.01); *G02B 6/136* (2013.01); *H01L 25/167* (2013.01); *H01L 2224/16225* (2013.01); *H01L 2224/32225* (2013.01); *H01L 2224/73204* (2013.01); *H01L 2924/0002* (2013.01); *H01S 5/005* (2013.01); *H01S 5/183* (2013.01); *H01S 5/3013* (2013.01)

(56) References Cited

U.S. PATENT DOCUMENTS

| | | |
|---|---|---|
| 5,767,001 A | 6/1998 | Bertagnolli et al. |
| 5,987,202 A | 11/1999 | Gruenwald et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,807,218 B1 | 10/2004 | Greenwood et al. |
| 6,832,013 B1 | 12/2004 | Kuhmann et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 9,618,712 B2 | 4/2017 | Kuo et al. |
| 10,539,751 B2 | 1/2020 | Lee et al. |
| 2003/0113067 A1 | 6/2003 | Koh et al. |
| 2003/0161603 A1 | 8/2003 | Nadeau et al. |
| 2004/0091211 A1 | 5/2004 | Umebayshi et al. |
| 2004/0202428 A1 | 10/2004 | Hwang et al. |
| 2005/0063634 A1 | 3/2005 | Cohen et al. |
| 2005/0100264 A1 | 5/2005 | Kim et al. |
| 2005/0224946 A1 | 10/2005 | Dutta et al. |
| 2006/0239605 A1 | 10/2006 | Palen et al. |
| 2009/0022500 A1 | 1/2009 | Pinguet et al. |
| 2009/0129783 A1 | 5/2009 | Ori et al. |
| 2010/0119231 A1 | 5/2010 | Kim et al. |
| 2010/0215314 A1 | 8/2010 | Lau et al. |
| 2010/0266241 A1 | 10/2010 | Hosoda |
| 2011/0102894 A1 | 5/2011 | Detry et al. |

OPTICAL BENCH, METHOD OF MAKING AND METHOD OF USING

PRIORITY CLAIM

The present application is a continuation of U.S. application Ser. No. 15/483,310, filed Apr. 10, 2017, which is a continuation of U.S. application Ser. No. 14/699,151, filed Apr. 29, 2015, now U.S. Pat. No. 9,618,712, issued Apr. 11, 2017, which was a continuation-in-part of U.S. application Ser. No. 13/403,566, filed Feb. 23, 2012, now U.S. Pat. No. 10,180,547, issued Jan. 15, 2019, all of which are incorporated herein by reference in their entireties.

The present application is related to U.S. application Ser. No. 16/247,332, filed Jan. 14, 2019, now U.S. Pat. No. 10,539,751, issued Jan. 21, 2020, which is incorporated herein by reference in its entirety.

TECHNICAL FIELD

The present disclosure relates generally to an integrated circuit.

BACKGROUND

A multi-chip module package (MCM) integrates chips with different functions and made of different processes. Some MCMs utilize substrate materials based on ceramic or organic polymers, which, in certain configurations, may have insufficient coefficient of thermal expansion (CTE) matching to semiconductor chips and/or heat dissipation property. This causes potential reliability issues for III-V semiconductor material based optoelectronic chips and/or high power amplifiers.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
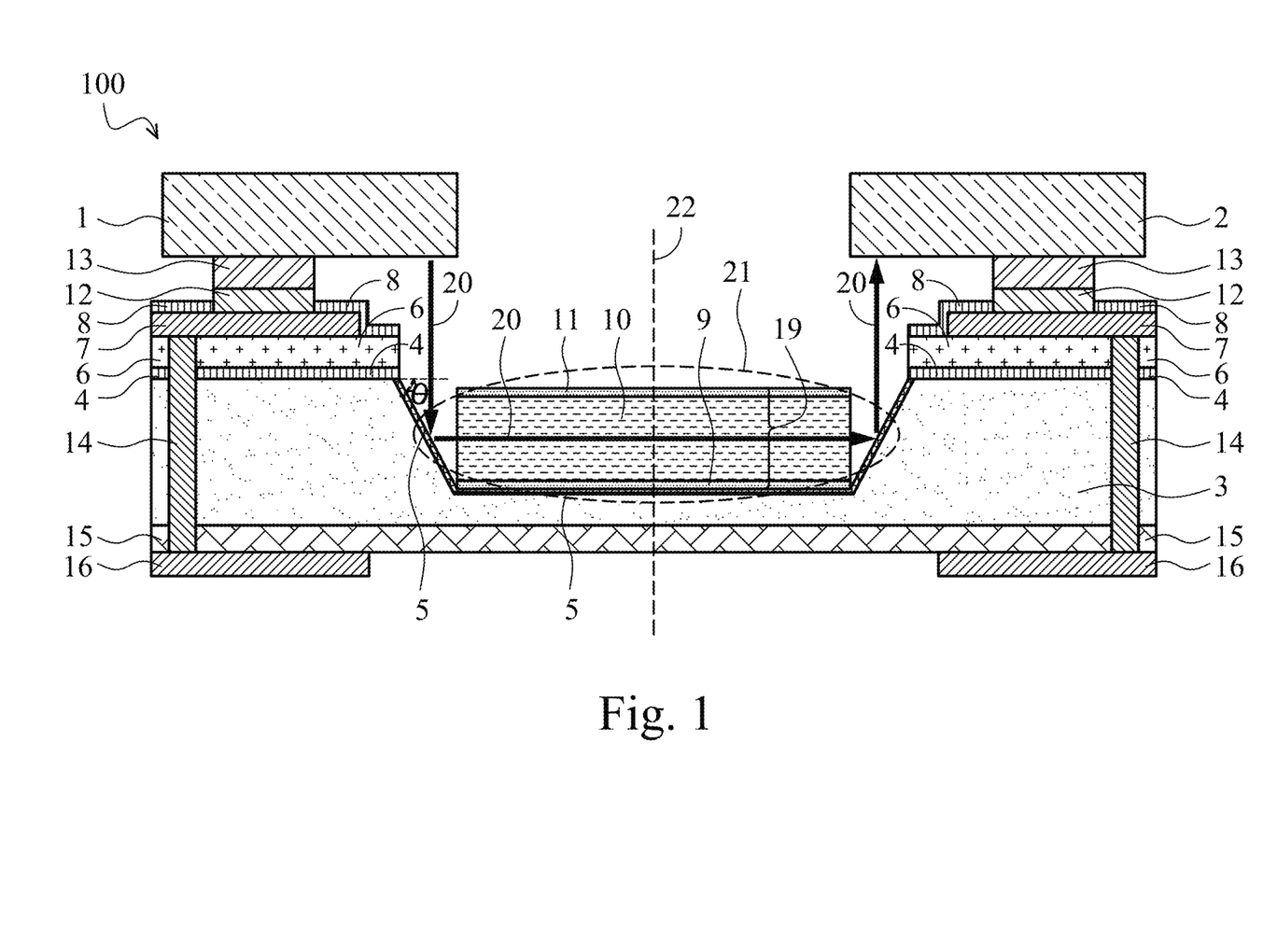
FIG. 1 is a cross-sectional diagram of an optical bench on substrate according to some embodiments.

FIG. 1 is a schematic diagram of an optical bench 100 on substrate according to some embodiments. The optical bench 100 includes a laser diode 1 and a photo diode 2 mounted on a substrate 3. The laser diode 1 and the photo diode 2 comprise III-V semiconductor materials and operate on electromagnetic wavelengths in the range of 450 nm-1700 nm in some embodiments. The substrate 3 comprises any suitable material, such as silicon. An etching hard mask 4 comprises SiN or $SiO_2$ and is able to achieve at least 30 μm etch depth in some embodiments. The etching hard mask layer 4 over the area for a trench 21 and/or an optical waveguide 19 is removed. In some examples, the etching hard mask layer 4 comprises SiN of at least 30 nm in thickness. In further examples, the etching hard mask layer 4 comprises $SiO_2$ of at least 100 nm in thickness. A reflector layer 5 comprises at least one of Cu, Al, Ag, or Au, multi-layered dielectrics, or any other suitable material having a reflective property at desired electromagnetic wavelengths. In some embodiments, the reflector layer 5 has at least 90% reflectivity at selected wavelengths. In some embodiments, a material of reflector layer 5 is chosen to selectively reflect a desired waveband and to either absorb or transmit wavelengths outside the desired waveband.

A dielectric layer 6 comprises $SiO_2$ or other low-k dielectric materials such as porous $SiO_2$, organic polymers such as polymide or Polybenzobisoxazole (PBO), or hybrid-organic polymers such as polysiloxane in some embodiments. To achieve high performance at radio frequency (RF) and microwave frequency, the thickness of the dielectric layer 6 is at least 300 nm where substrate 3 is a high resistance silicon substrate (resistivity >3000 ohm-cm) in some embodiments. The thickness of the dielectric layer 6 is at least 1 μm where substrate 3 is part of normal resistance wafers (resistivity is from 1 ohm-cm to 10 ohm-cm) in some embodiments.

A redistribution layer (RDL) 7 over the substrate 3 is an electrically conductive layer on a chip that allows the Input Output (TO) pads of an integrated circuit available in other locations. The RDL 7 comprises Al, Cu, or any other suitable electrically conductive material, and has more than 1 μm thickness for high speed applications over 2 Gbps in some embodiments. A passivation layer 8 comprises $SiO_2$, SiON, SiN, multi-stacks of these materials, or any other suitable materials in some embodiments. The thickness of the passivation layer 8 is from about 200 nm to about 800 nm for pad protection in some embodiments.

A bottom cladding layer 9 comprises $SiO_2$/SiON in some embodiments. Bottom cladding layer 9 is formed by plasma-enhanced chemical vapor deposition (PECVD) in some embodiments. In some embodiments, spin-on dielectrics or polymers are used to form the bottom cladding layer 9. The thickness of the bottom cladding layer 9 is at least 500 nm in some embodiments to prevent optical leakage. A core layer 10 comprises SiON/SiN in some embodiments. Core layer 10 is formed by plasma-enhanced chemical vapor deposition (PECVD) in some embodiments. In some embodiments, spin-on dielectrics or polymers are used to form the core layer 10. The thickness of the core layer 10 is at least 15 μm in some embodiments. A top cladding layer 11 comprises $SiO_2$/SiON in some embodiments. Top cladding layer 11 is formed by plasma-enhanced chemical vapor deposition (PECVD) in some embodiments. In some embodiments, spin-on dielectrics or polymers are used to form the top cladding layer 11. The thickness of the top cladding layer 11 is at least 500 nm in some embodiments to prevent optical leak. In some embodiment, an optical fiber can be placed in the trench 21 as the waveguide 19.

The bottom cladding layer 9, the core layer 10, and the top cladding layers 11 form the waveguide 19 inside a trench 21 as an optical link medium for the electromagnetic wavelengths used by the laser diode 1 and/or the photo diode 2. The refractive index of the core layer 10 is higher than that of the bottom and top cladding layers 9 and 11, and the refractive index difference is at least 0.02 in some embodiments to prevent optical leakage. In at least one example, three polymer layers for the bottom cladding layer 9, the core layer 10, and the top cladding layer 11 are deposited by a spin on process, and then a lithography process is used to define dimensions of the optical waveguide 19. An optical path 20 is an exemplary light path of light (electromagnetic wave) emitted from the laser diode 1, reflected by first a sloping side of the reflector layer 5, through the optical waveguide 19, reflected by a second sloping side of the reflector layer 5, then to the photo diode 2.

An under-bump metallization (UBM) layer 12 comprises any suitable under-bump metallurgy, e.g., Cu/Ni, in some embodiments. A bump layer 13 comprises lead-free solder or gold bumps in some embodiments. In some embodiments, bump layer 13 comprises a copper pillar. The bump layer 13 comprises micro bumps for flip-chip bonding with semiconductor-based optical and electrical chip in some embodiments. The overall thickness for the UBM layer 12 and the bump layer 13 is from about 1 μm to about 15 μm in some embodiments. Through substrate vias (TSVs) 14 formed through the substrate 3 comprises Cu or any other suitable electrically conductive materials in some embodiments. The TSVs 14 are used to provide backside electrical connections, and are fabricated using any suitable methods and materials known in the art.

Another dielectric layer 15 comprises $SiO_2$ or other low-k dielectric material such as porous $SiO_2$, organic polymers such as polymide or Polybenzobisoxazole (PBO), or hybrid-organic polymers such as polysiloxane in some embodiments. To achieve high performance at radio frequency (RF) and microwave frequency, a thickness of the dielectric layer 15 is at least 300 nm where substrate 3 is a high resistance silicon substrate (resistivity >3000 ohm-cm) in some embodiments. The thickness of dielectric layer 15 is at least 1 μm where substrate 3 is part of normal resistance wafers (resistivity is from 1 ohm-cm to 10 ohm-cm) in some embodiments. A backside redistribution layer (RDL) 16 comprises Al, Cu, or any other suitable electrically conductive material, and has more than 1 μm thickness for high speed applications over 2 Gbps in some embodiments.

The trench 21 has sloping sides with a slope angle θ ranging from about 42° to about 48° with respect to a top surface of substrate 3 and has a depth of more than 30 μm in some embodiments to accommodate the optical beam from the laser diode 1, e.g., a vertical cavity surface emitting laser (VCSEL). In some embodiments, laser diode 1 has a beam diversion angle of about 20°-30° with a beam size of about 10 μm to about 15 μm.

The integrated optical bench 100 on substrate facilitates coupling the light from the laser diode 1 to the reflector layer 5 and into the waveguide 19. The integrated optical ben 100 also leads the light out of waveguide 19 to the reflector layer 5 to be received by the detector diode 2. The optical bench 100 on substrate is implemented with one portion on either side of the line 22 in some embodiments. For example, in one or more embodiments, the optical bench 100 includes the transmitting portion on the left side of the line 22 and having the laser diode 1 as a transmitter. In one or more embodiments, the optical bench 100 includes the receiving portion on the right side of the line 22 and having the photo diode 2 as a receiver. The large waveguide 19 dimension (greater than 15 μm in some embodiments) also allows light to be coupled into and out of optical fibers for out-of-chip communication with separate chips of a semiconductor device.

The optical bench 100 on substrate structure can provide better coefficient of thermal expansion (CTE) matching and/or heat dissipation for optical components such as the laser diode 1 and the photo diode 2 mounted on the substrate 3 when the substrate 3 comprises semiconductor materials such as silicon, compared to other substrate or interposer materials such as ceramic or organic polymer. More robust and cost efficient integration of optics using silicon micro-fabrication technology is achieved by the optical bench 100 on substrate compared to some other assembly using discrete optical components. Also, there is less crosstalk among optical channels by using the optical waveguide 19 to help secure data transfer.

Furthermore, by configuring the optical bench 100 as a transmitting portion (e.g., the portion on the left side of the line 22 and having the laser diode 1 as a transmitter), or as a receiving portion (e.g., the portion on the right side of the line 22 and having the photo diode 2 as a receiver), inclusion of an optical input/output off the package is possible. This optical bench 100 on substrate platform offers higher data rate transfers inside the package than typical electrical connections by integrating optical components and optical options for signal input and output.

Figure 2A:
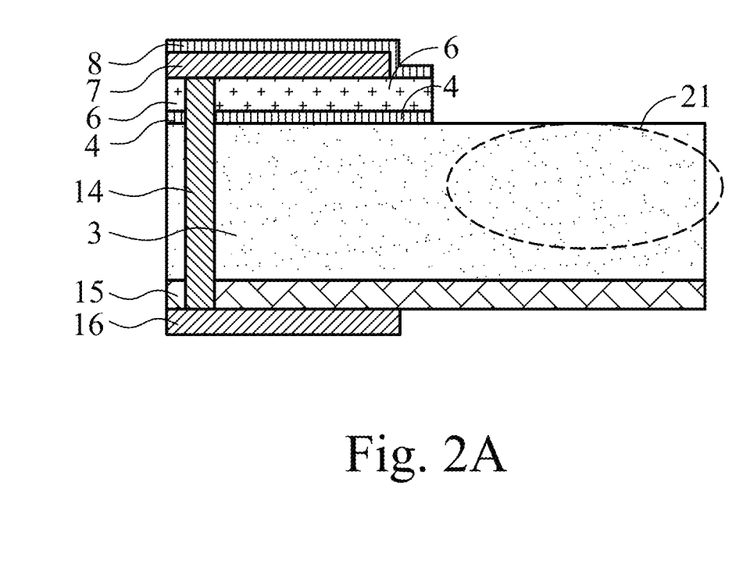
FIGS. 2A-2E are cross-sectional diagrams of various steps of fabrication process of the optical bench on substrate in FIG. 1 according to some embodiments.

FIGS. 2A-2E are schematic diagrams of various steps of fabrication process of the optical bench on substrate in FIG. 1 according to some embodiments. In FIG. 2A, the RDL 7 is formed over the dielectric layer 6, e.g., by physical vapor deposition (PVD), for metal routing and metal traces for high speed electrical signal propagation. The passivation layer 8 (e.g., silicon nitride or oxide) is deposited afterward for metal protection, e.g., by chemical vapor deposition (CVD). The passivation layer 8, the dielectric layer 6, and the etching hard mask 4, e.g., silicon nitride or silicon oxide, are removed from an area where the trench 21 is to be formed.

Figure 2B:
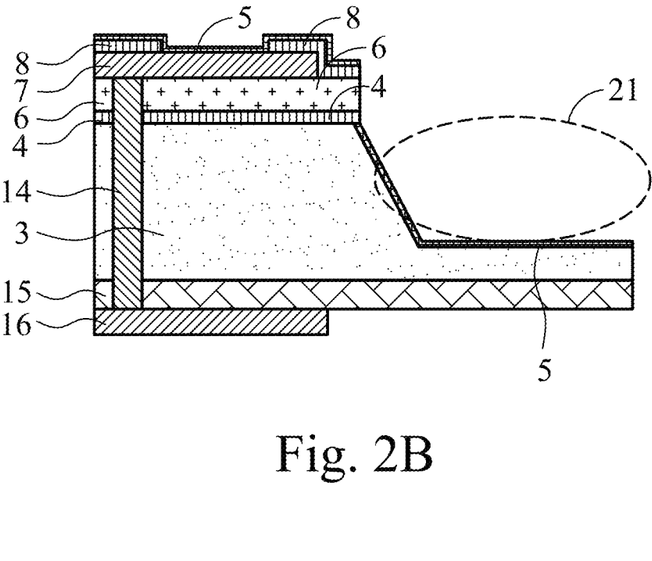

In FIG. 2B, the trench 21 (at least 30 μm deep in some embodiments), including the sloping sides with a slope angle θ, is fabricated by wet etching using KOH(aq)/IPA or TMAH solution. One method to control the anisotropic wet etching is achieved by using KOH (25 wt %-35 wt %) with no less than 5 wt % IPA quantity. The temperature is kept at about 60° C.-70° C. during the wet etching to achieve a reasonable etch rate of 0.2-0.6 microns per minute during the wet etching and to prevent excessive hillock formation.

The reflector layer 5 having sloping sides with a slope angle θ (e.g., 42°-48°) is formed on the trench 21. This step may include depositing an adhesion dielectric layer, then a barrier/adhesion metal layer, such as Ti or Cr, and finally a highly reflective metal such as Al, Cu, Ag, or Au with a thickness greater than 50 nm to achieve reflectivity greater than 90% in some embodiments. The deposition process is performed by physical vapor deposition (PVD) or electroplating, in at least one example. Any other suitable reflective material or process is also usable.

Figure 2C:
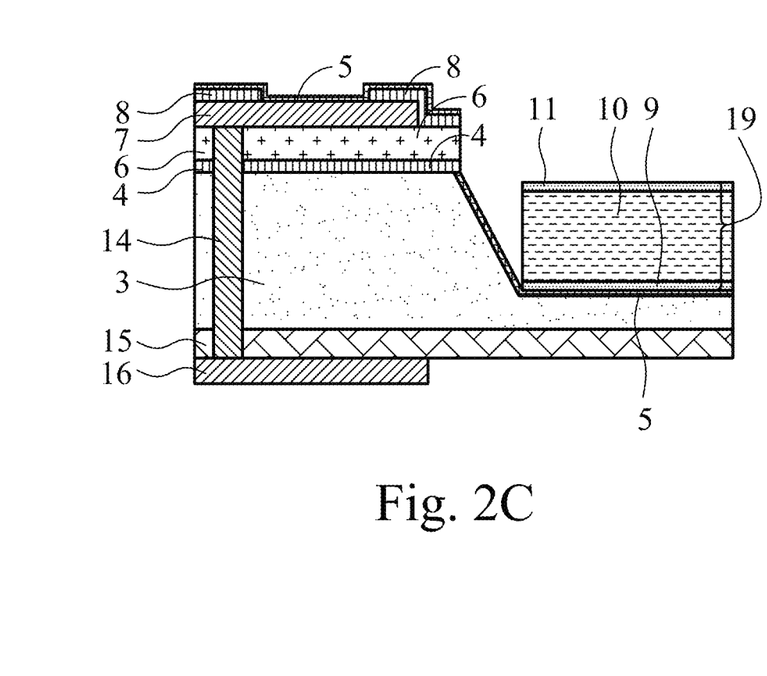

In FIG. 2C, the waveguide 19, e.g., polymer, for the optical path inside the trench 21 is formed. This step includes forming the bottom cladding layer 9 (e.g., dielectric or polymer) by chemical vapor deposition (CVD) or a coater (for dielectric or polymer), then the core layer 10 (e.g., polymer), and the top-cladding layer 11 (e.g., dielectric or polymer) in some embodiments. The waveguide 19 can be defined by etching and unnecessary portions of the reflector layer 5 are removed in some embodiments. In some embodiments, a portion of an optical fiber is placed in the trench 21 as the waveguide 19.

Figure 2D:
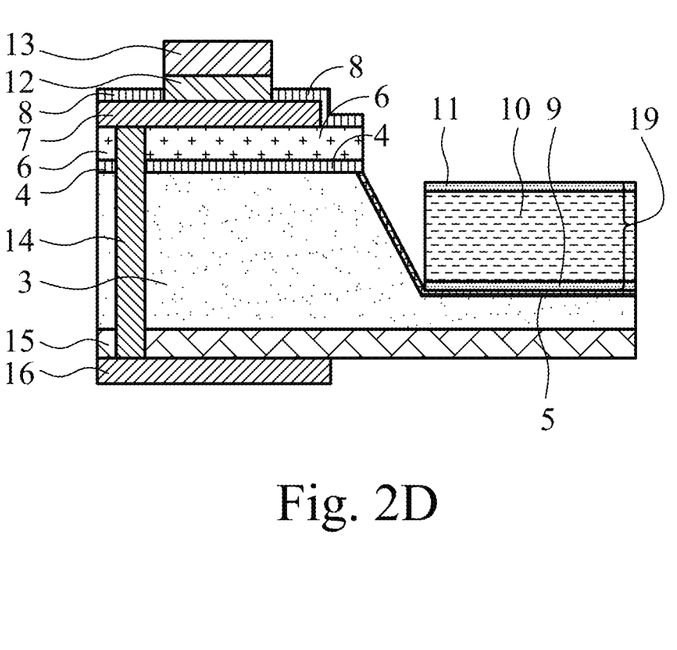

In FIG. 2D, the UBM layer 12 such as Cu/Ni is formed, e.g., by evaporation or sputtering, or by chemically plating. A bump layer 13 is formed or placed on the UBM layer 12 in many ways, including evaporation, electroplating, printing, jetting, stud bumping, and direct placement.

Figure 2E:
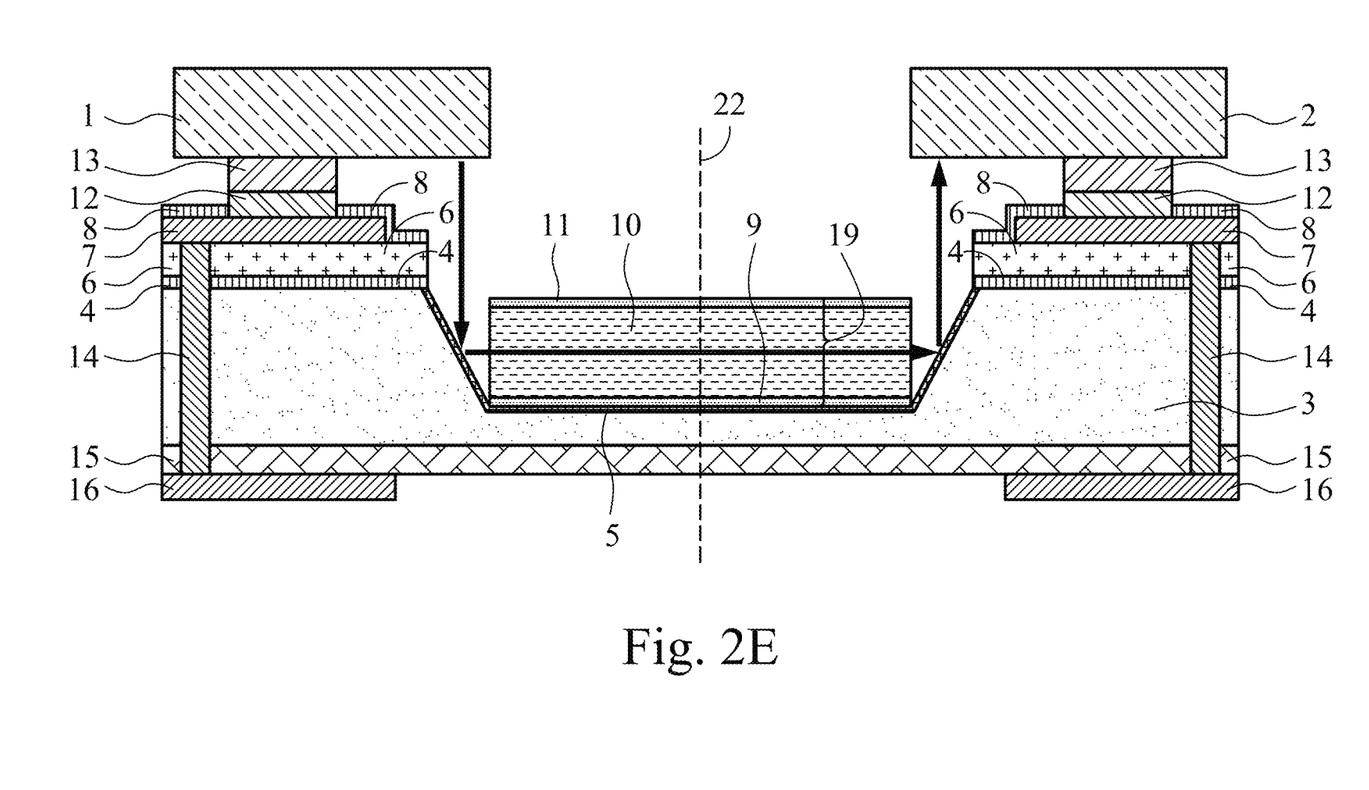

In FIG. 2E, the laser diode 1 and the photo diode 2, as well as other driver or transimpedance amplifier (TIA) chips, are flip-chip mounted (and/or wire-bonded as necessary) over the substrate 3. In FIG. 2E, the portion on the left side of the line 22 is the transmitting portion of the optical bench shown in FIGS. 2A-2D, and the portion on the right side of the line 22 is a receiving portion that can be fabricated in the same or similar process flow described with respect to FIGS. 2A-2D.

Figure 3A:
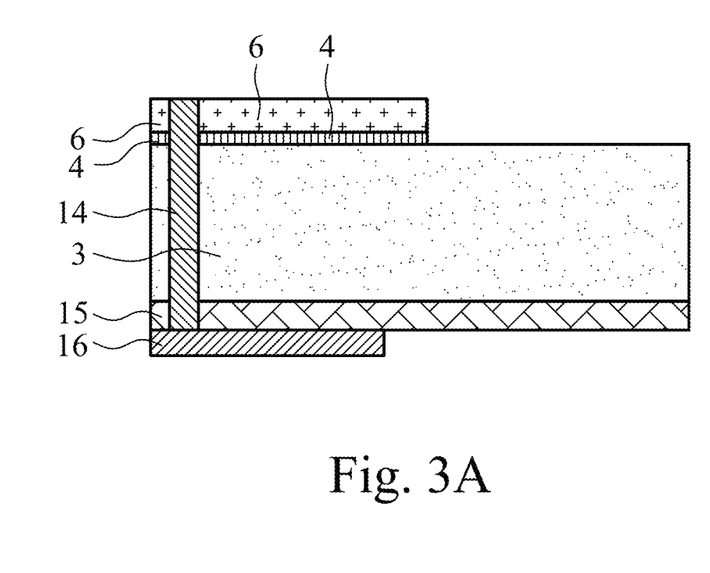
FIGS. 3A-3C are cross-sectional diagrams of various steps of another fabrication process of the optical bench on substrate in FIG. 1 according to some embodiments.
Figure 3B:
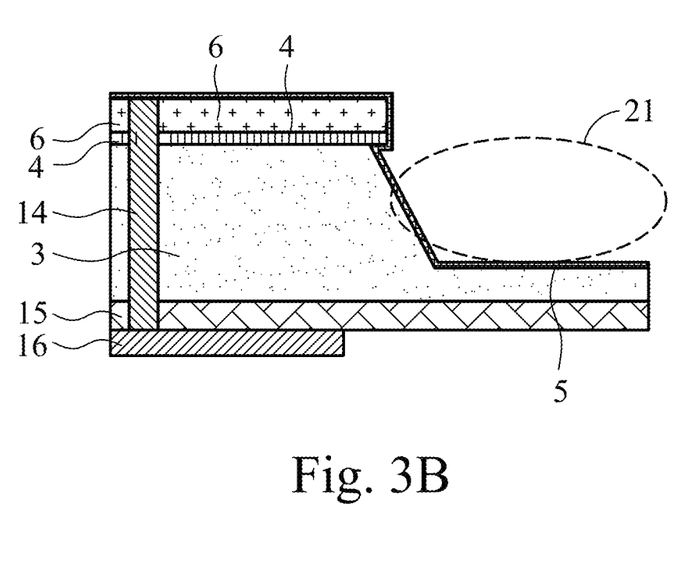
Figure 3C:
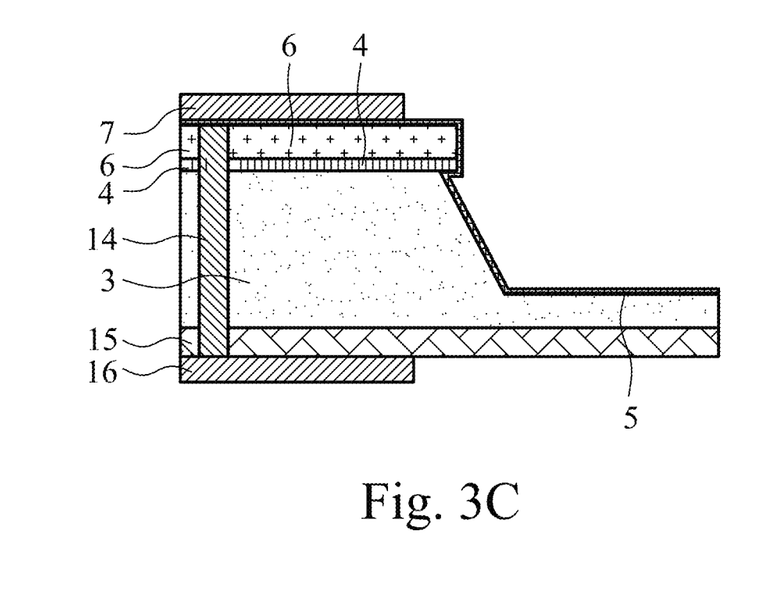

FIGS. 3A-3C are schematic diagrams of various steps of another fabrication process of the optical bench on substrate in FIG. 1 according to some embodiments. In FIG. 3A, the etching hard mask 4 and the dielectric layer 6 are formed over the substrate 3. The etching hard mask 4, e.g., silicon nitride or silicon oxide, and the dielectric layer 6 are removed from an area where the trench 21 is to be formed.

In FIG. 3B, the trench 21 with the slope angle θ (as shown in FIG. 1) is formed by etching, e.g., using KOH(aq)/IPA or TMAH solution. One method to control the anisotropic wet etching is achieved by using KOH (25 wt %-35 wt %) with no less than 5 wt % IPA quantity. The temperature is kept at about 60° C.-70° C. during the wet etching to achieve a reasonable etch rate of 0.2-0.6 microns per minute during the wet etching and to prevent excessive hillock formation.

The reflector layer 5 having a slope angle θ (e.g., 42°-48°) is formed on the sloping side of the trench 21. This step may include depositing an adhesion dielectric layer, then a barrier/adhesion metal layer, such as Ti or Cr, and finally a highly reflective metal such as Al, Cu, Ag, or Au with a thickness greater than 50 nm to achieve reflectivity greater than 90% in some embodiments. The deposition process is performed by physical vapor deposition (PVD) or electroplating, in at least one example. Any other suitable reflective material or process is usable. The reflector layer 5 is removed in areas where it is not necessary by a lithography process in some embodiments.

In FIG. 3C, the RDL 7 is formed and defined for metal routing and metal traces for high speed electrical signal propagation. Additional dielectric layer for electrical isolation and microwave confinement can be formed as necessary. After the step in FIG. 3C, the process flow can proceed to the operation of forming the passivation layer 8 (e.g., silicon nitride or oxide) for metal protection as described with respect to FIG. 2A, and then proceed to the steps described in FIGS. 2C-2E afterwards.

Figure 4:
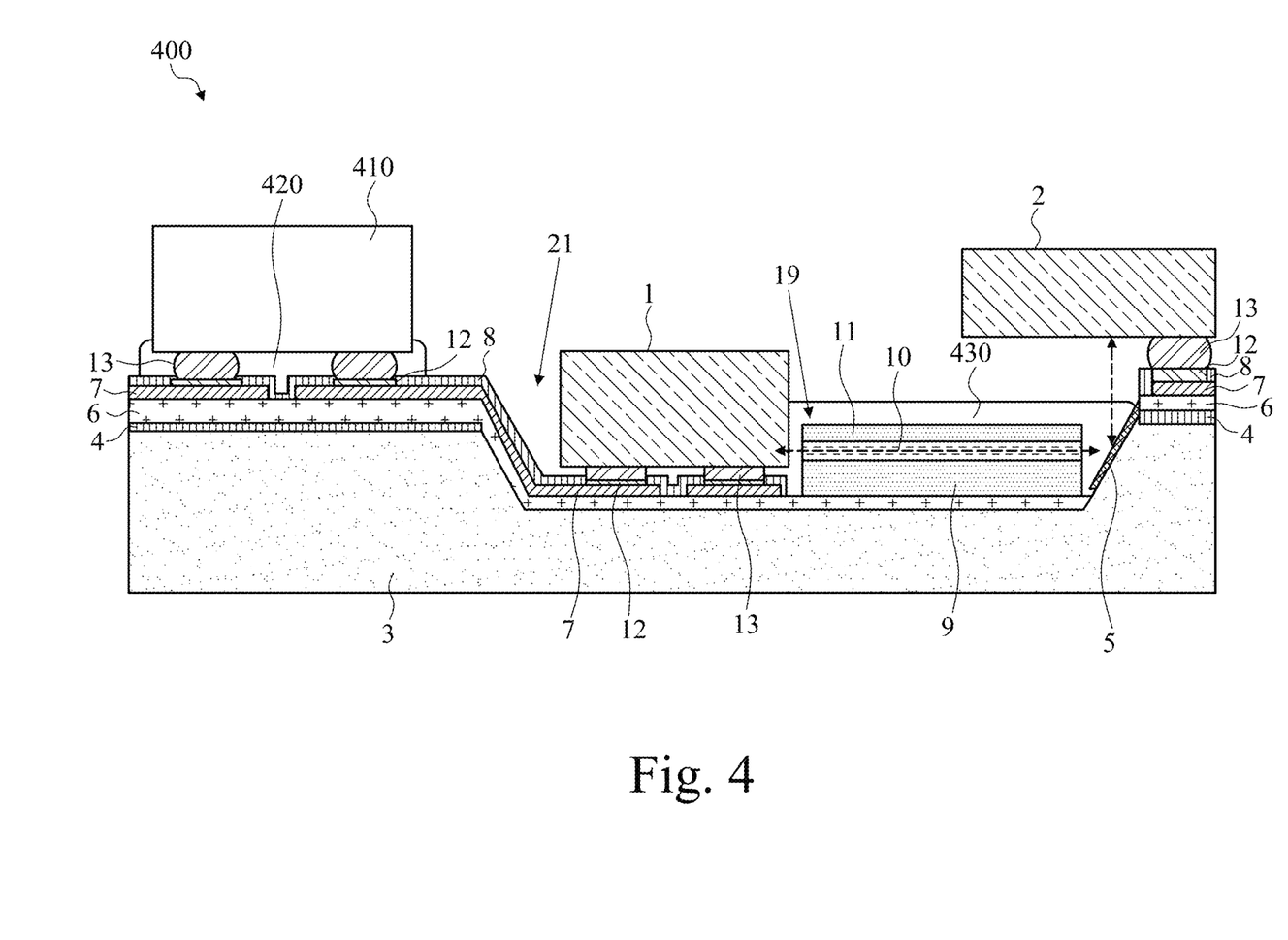
FIG. 4 is a cross-sectional diagram of an optical bench on a substrate according to some embodiments.

FIG. 4 is a cross-sectional diagram of an optical bench 400 on a substrate according to some embodiments. Optical bench 400 includes similar elements as optical bench 100. Same elements have a same reference number. In comparison with optical bench 100, optical bench 400 includes laser diode 1 within trench 21. In some embodiments, laser diode 1 is called a light emitting device. RDL 7 electrically connects laser diode 1 to an active circuit 410. Active circuit 410 is configured to generate a signal to provide information to laser diode 1 for emitting light to be received by photodetector 2. In some embodiments, photodetector 2 is called a light receiving device. Optical bench 400 also includes an underfill material 420 between active circuit 410 and passivation layer 8 to help increase mechanical strength of optical bench 400 in comparison to structures which do not include underfill material 420. An optically transparent material 430 is between laser diode 1 and waveguide 19.

Optically transparent material 430 helps to increase an amount of light propagated between laser diode 1 and photodetector 2 by reducing light scattering, and reflection at an interface of laser diode 1 and a surrounding environment. Optically transparent material 430 increases an amount of light propagated between laser diode 1 and photodetector 2 due to refractive index matching. That is, a difference in a refractive index at an output of laser diode 1 and optically transparent material 430 is less than a difference in the refractive index at the output of the laser diode and the surrounding environment. In some embodiments, optically transparent material 430 comprises spin-on glass, an organic material, a polymer material, or another suitable material.

Trench 21 includes two sloped sides. In some embodiments, a side between active circuit 410 and laser diode 1 is substantially perpendicular to a top surface of substrate 3. In some embodiments, reflector layer 5 extends between a bottom surface of waveguide 19 and substrate 3. In some embodiments, reflector layer 5 is located only on the sloped side of trench 21.

Optical bench 400 includes a single active circuit 410 connected to laser diode 1. In some embodiments, optical bench 400 includes multiple active circuits 410 connected to laser diode 1. In some embodiments having multiple active circuits 410, laser diode is selectively connected to each of the active circuits 410. In some embodiments, a control system is configured to control which of the multiple active circuits 410 are connected to laser diode 1 at any particular time. In some embodiments, at least one active circuit 410 is selectively connected to laser diode 1 by a TSV, such as TSV 14.

Optical bench 400 includes laser diode 1 in trench 21. In some embodiments, photodetector 2 is located in trench 21 and laser diode 1 is located outside of the trench. In some embodiments, photodetector 2 is electrically connected to one or more active circuits similar to active circuit 410. Photodetector 2 is configured to convert a received optical signal from laser diode 1 into an electrical signal. This electrical signal is then provided to the at least one active circuit connected to photodetector 2. In some embodiments where multiple active circuits are connected to photodetector 2, a control system is configured to selectively determine which of the active circuits are connected to the photodetector at any one time. In some embodiments, the control system for controlling connections between active circuits 410 and laser diode 1 is a same control system as that for controlling connections between active circuits and photodetector 2. In some embodiments, the control system for controlling connections between active circuits 410 and laser diode 1 is different from the control system for controlling connections between active circuits and photodetector 2.

In some embodiments, both laser diode 1 and photodetector 2 are located within trench 21. In embodiments where both laser diode 1 and photodetector 2 are located within trench 21, waveguide 19 and optically transparent material 430 are between the laser diode and the photodetector. In some embodiments where both laser diode 1 and photodetector 2 are located within trench 21, the trench has no sloped sides or reflector layer 5 is omitted.

In some embodiments, optical bench 400 is formed in a manner similar to that described in FIGS. 2A-2E or in FIGS. 3A-3C. In comparison with the method of making described in FIGS. 2A-2E and FIGS. 3A-3C, optical bench 400 includes bonding laser diode 1 in trench 21 sequentially with forming waveguide 19. In some embodiments, waveguide 19 is formed in trench 21 prior to bonding of laser diode 1 in trench 21. In some embodiments, waveguide 19 is formed in trench after bonding of laser diode 1 in trench. In some embodiments, at least a part of waveguide 19 is formed in trench 21 simultaneously with boding laser diode 1 in trench 21. Following bonding laser diode 1 and waveguide 19 in trench 21, optically transparent material 430 is deposited around waveguide 19. In some embodiments, optically transparent material 430 is deposited using a spin-on process, a PVD process or a CVD process. In some embodiments, a material removal step, such as etching, is used to remove optically transparent material 430 from undesired locations following the deposition step. In some embodiments where photodetector 2 is in trench 21, the photodetector is bonded in the trench sequentially with formation of waveguide 19 in the trench. In some embodiments where photodetector 2 is in trench 21, the photodetector is bonded in the trench simultaneously with formation of at least a part of waveguide 19 in the trench. In some embodiments where both photodetector 2 and laser diode 1 are in trench 21, the photodetector is bonded in the trench sequentially with the laser diode. In some embodiments where both photodetector 2 and laser diode 1 are in trench 21, the photodetector is bonded in the trench simultaneously with the laser diode.

An aspect of this description relates to a method of forming an optical bench. The method includes forming a reflector layer over a sloping side of a substrate. The method includes depositing a redistribution layer over the substrate. The method includes disposing an under bump metallization (UBM) layer over the redistribution layer. The method includes forming a passivation layer over the redistribution layer and surrounding sidewalls of the UBM layer. The method includes mounting a first optical component over an uppermost portion of the substrate, wherein the reflector layer is configured to reflect an electromagnetic wave from the first optical component, and the first optical component is mounted outside the trench. In some embodiments, the method further includes forming a waveguide in the trench. In some embodiments, the method further includes mounting a second optical component over the uppermost portion of the substrate, wherein the second optical component is configured to optically communicate with the first optical component through the waveguide. In some embodiments, the method further includes mounting a second optical component in the trench, wherein the second optical component is configured to optically communicate with the first optical component through the waveguide. In some embodiments, the method further includes depositing an optical transparent material over the waveguide, wherein the optically transparent material directly contacts the waveguide and the second optical component. In some embodiments, the method further includes mounting an active circuit over the uppermost surface of the substrate. In some embodiments, the method further includes electrically connecting the active circuit to the second optical component.

An aspect of this description relates to a method of using an optical bench. The method includes emitting light from a first optical component, wherein the waveguide extends over a trench in a substrate, and the first optical component is outside of the trench. The method further includes reflecting the emitted light using a first sidewall of the trench. The method further includes reflecting the light from the first sidewall of the trench using a second sidewall of the trench. The method further includes receiving the light from the second sidewall of the trench by a second optical component, wherein the second optical component is outside of the trench. In some embodiments, the method further includes guiding the light from the first sidewall of the trench to the second sidewall of the trench using a waveguide in the trench. In some embodiments, wherein reflecting the emitting light includes reflecting the emitted light using the first sidewall of the trench at an angle from about 42-degrees to about 48-degrees with respect to an uppermost surface of the substrate. In some embodiments, the method further includes transferring an electrical signal between the second optical component and a redistribution layer along a bottommost surface of the substrate. In some embodiments, transferring the electrical signal includes transferring the electrical signal using a through substrate via (TSV) outside of the trench. In some embodiments, receiving the light from the second sidewall includes receiving the light by the second optical component extending over the trench in the substrate.

An aspect of this description relates to an optical bench. The optical bench includes a substrate defining a trench therein. The optical bench further includes a first optical component mounted on the substrate, wherein the first optical component is configured to emit light. The optical bench further includes a first reflective layer over a first sidewall surface of the trench, wherein the first reflective layer is configured to reflect the emitted light. The optical bench further includes a second optical component on an uppermost surface of the trench, wherein the second optical component extends over the trench, and the second optical component is configured to receive light reflected from the first reflective layer. In some embodiments, the first optical component is in the trench. In some embodiments, the first optical component is on the uppermost surface of the trench. In some embodiments, the optical bench further includes a waveguide, wherein the waveguide is optically between the first optical component and the second optical component. In some embodiments, the first reflective layer is optically between the first optical component and the waveguide. In some embodiments, the first reflective layer is optically between the second optical component and the waveguide. In some embodiments, the optical bench further includes a second reflective layer over a second sidewall of the trench, wherein the first reflective layer is configured to receive the emitted light via the second reflective layer.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A method of forming an optical bench, comprising:
    forming a reflector layer over a sloping side of a trench in a substrate;
    depositing a redistribution layer over the substrate;
    disposing an under bump metallization (UBM) layer over the redistribution layer;
    forming a passivation layer over the redistribution layer and surrounding sidewalls of the UBM layer; and
    mounting a first optical component over an uppermost portion of the substrate, wherein the reflector layer is configured to reflect an electromagnetic wave from the first optical component, and the first optical component is mounted outside the trench.

2. The method of claim 1, further comprising forming a waveguide in the trench.

3. The method of claim 2, further comprising mounting a second optical component over the uppermost portion of the substrate, wherein the second optical component is configured to optically communicate with the first optical component through the waveguide.

4. The method of claim 2, further comprising mounting a second optical component in the trench, wherein the second optical component is configured to optically communicate with the first optical component through the waveguide.

5. The method of claim 4, further comprising depositing an optical transparent material over the waveguide, wherein the optically transparent material directly contacts the waveguide and the second optical component.

6. The method of claim 4, further comprising mounting an active circuit over the uppermost surface of the substrate.

7. The method of claim 6, further comprising electrically connecting the active circuit to the second optical component.

8. A method of using an optical bench, comprising:
    emitting light from a first optical component, wherein a waveguide extends over a trench in a substrate, and the first optical component is outside of the trench;
    reflecting the emitted light using a first sidewall of the trench;
    reflecting the emitted light from the first sidewall of the trench using a second sidewall of the trench; and
    receiving the emitted light from the second sidewall of the trench by a second optical component, wherein the second optical component is outside of the trench.

9. The method of claim 8, further comprising guiding the light from the first sidewall of the trench to the second sidewall of the trench using a waveguide in the trench.

10. The method of claim 8, wherein reflecting the emitted light comprises reflecting the emitted light using the first sidewall of the trench at an angle from about 42-degrees to about 48-degrees with respect to an uppermost surface of the substrate.

11. The method of claim 8, further comprising transferring an electrical signal between the second optical component and a redistribution layer along a bottommost surface of the substrate.

12. The method of claim 11, wherein transferring the electrical signal comprises transferring the electrical signal using a through substrate via (TSV) outside of the trench.

13. The method of claim 8, wherein receiving the light from the second sidewall comprises receiving the light by the second optical component extending over the trench in the substrate.

14. An optical bench comprising:
    a substrate defining a trench therein;
    a first optical component mounted on the substrate, wherein the first optical component is configured to emit light;
    a first reflective layer over a first sidewall surface of the trench, wherein the first reflective layer is configured to reflect the emitted light; and
    a second optical component on an uppermost surface of the trench, wherein the second optical component extends over the trench, and the second optical component is configured to receive light reflected from the first reflective layer.

15. The optical bench of claim 14, wherein the first optical component is in the trench.

16. The optical bench of claim 14, wherein the first optical component is on the uppermost surface of the trench.

17. The optical bench of claim 14, further comprising a waveguide, wherein the waveguide is optically between the first optical component and the second optical component.

18. The optical bench of claim 17, wherein the first reflective layer is optically between the first optical component and the waveguide.

19. The optical bench of claim 17, wherein the first reflective layer is optically between the second optical component and the waveguide.

20. The optical bench of claim 14, further comprising a second reflective layer over a second sidewall of the trench, wherein the first reflective layer is configured to receive the emitted light via the second reflective layer.

* * * * *